(12) United States Patent
Yong et al.

(10) Patent No.: US 10,872,848 B2
(45) Date of Patent: Dec. 22, 2020

(54) SEMICONDUCTOR PACKAGE WITH LEADFRAME INTERCONNECTION STRUCTURE

(71) Applicant: Infineon Technologies AG, Neubiberg (DE)

(72) Inventors: Woon Yik Yong, Singapore (SG); Andreas Kucher, Villach (AT); Chia-Yen Lee, Singapore (SG); Shao Ping Wan, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 170 days.

(21) Appl. No.: 16/170,692

(22) Filed: Oct. 25, 2018

(65) Prior Publication Data

US 2020/0135626 A1 Apr. 30, 2020

(51) Int. Cl.
*H01L 23/495* (2006.01)
*H01L 23/00* (2006.01)

(52) U.S. Cl.
CPC ........ *H01L 23/49575* (2013.01); *H01L 24/11* (2013.01); *H01L 24/17* (2013.01); *H01L 2224/0401* (2013.01); *H01L 2224/16227* (2013.01); *H01L 2924/014* (2013.01); *H01L 2924/12042* (2013.01)

(58) Field of Classification Search
CPC ..... H01L 23/49575; H01L 24/11; H01L 24/17
See application file for complete search history.

(56) References Cited

U.S. PATENT DOCUMENTS

| | | | | |
|---|---|---|---|---|
| 6,118,184 A | * | 9/2000 | Ishio | H01L 21/565 257/787 |
| 6,133,067 A | * | 10/2000 | Jeng | H01L 21/56 438/110 |
| 2002/0096748 A1 | | 7/2002 | Pavier | |
| 2004/0061202 A1 | * | 4/2004 | Shim | H01L 24/32 257/666 |
| 2005/0275082 A1 | | 12/2005 | Ferrara et al. | |
| 2009/0127676 A1 | * | 5/2009 | Gomez | H01L 23/49575 257/666 |
| 2015/0303128 A1 | * | 10/2015 | Otremba | H01L 23/49575 257/676 |

* cited by examiner

*Primary Examiner* — Douglas M Menz
(74) *Attorney, Agent, or Firm* — Murphy, Bilak & Homiller, PLLC

(57) ABSTRACT

An embodiment of a semiconductor package includes a leadframe and a mold compound partly encasing the leadframe so that leads protrude from the mold compound and at least two die pads have a surface at a first side of the leadframe which is not covered by the mold compound. A laser module is attached to the surface of the at least two die pads which is not covered by the mold compound. A driver die is attached to the leadframe at a second side of the leadframe opposite the first side so that the laser module and the driver die are disposed in a stacked arrangement, the driver die configured to control the laser module. The driver die is in direct electrical communication with the laser module only through the leadframe and any interconnects which attach the laser module and driver die to the leadframe.

15 Claims, 8 Drawing Sheets

SEMICONDUCTOR PACKAGE WITH LEADFRAME INTERCONNECTION STRUCTURE

BACKGROUND

Various types of applications require low inductance electrical connections between system components. For example, LIDAR (light detection and ranging) is an application that measures distance to a target by illuminating the target with pulsed laser light and measuring the reflected pulses with a sensor. LIDAR has many applications, including 3D (three-dimensional) mapping, autonomous and non-autonomous automotive and non-automotive vehicles, distance measurement, laser scanners, fiber optic integrity instruments, to name a few. For example, differences in laser return times and wavelengths can be used to construct 3D representations of a target. For a LIDAR system to locate and identify objects in real time, the light emission and sensing functions of the LIDAR system must be performed at high frequency, e.g. millions of times per second (nanosecond range). Low inductance electrical connections between LIDAR system components is needed to meet such high frequency requirements. In another example, low inductance electrical connections between a power transistor die and the driver for the power transistor in power module applications such as automotive and solar inverters are needed to increase switching frequency capability.

Thus, there is a need for a semiconductor package technology with low inductance electrical connections between components of the package.

SUMMARY

According to an embodiment of a semiconductor package, the semiconductor package comprises: a leadframe comprising leads and a plurality of die pads; a mold compound partly encasing the leadframe so that the leads protrude from the mold compound and at least two of the plurality of die pads have a surface at a first side of the leadframe which is not covered by the mold compound; a laser module attached to the surface of the at least two die pads which is not covered by the mold compound, the laser module configured to emit laser light outward from the semiconductor package; and a driver die attached to the leadframe at a second side of the leadframe opposite the first side so that the laser module and the driver die are disposed in a stacked arrangement, the driver die configured to control the laser module. The driver die is in direct electrical communication with the laser module only through the leadframe and any interconnects which attach the laser module and the driver die to the leadframe.

In one embodiment of the semiconductor package, the leads extend along a first plane within the mold compound, and the at least two die pads extend along a second plane within the mold compound different than the first plane so that a step is provided between the at least two die pads and the leads within the mold compound.

In another embodiment of the semiconductor package, the leads and the at least two die pads extend along a same first plane within the mold compound.

Separately or in combination, the mold compound may have an opening which extends to the surface of the at least two die pads and the laser module may be disposed in the opening.

Separately or in combination, the semiconductor package may further comprise a transparent epoxy covering the laser module and filling the opening in the mold compound.

Separately or in combination, a thickness of the laser module may be less than a height of the opening in the mold compound, the thickness of the laser module and the height of the opening being measured in a direction perpendicular to the first side of the leadframe.

Separately or in combination, the semiconductor package may further comprise one or more capacitors attached to the first side of the leadframe or to a second side of the leadframe opposite the first side.

Separately or in combination, the one or more capacitors may be encased in the mold compound.

Separately or in combination, the first side of the leadframe may not be covered by the mold compound so that the one or more capacitors are not encased in the mold compound.

According to an embodiment of a method of manufacturing a semiconductor package, the method comprises: providing a leadframe comprising leads and a plurality of die pads; partly encasing the leadframe in a mold compound so that the leads protrude from the mold compound and at least two of the plurality of die pads have a surface at a first side of the leadframe which is not covered by the mold compound; attaching a laser module to the surface of the at least two die pads which is not covered by the mold compound, the laser module configured to emit laser light outward from the semiconductor package; and attaching a driver die to the leadframe at a second side of the leadframe opposite the first side so that the laser module and the driver die are disposed in a stacked arrangement, the driver die configured to control the laser module. The driver die is in direct electrical communication with the laser module only through the leadframe and any interconnects which attach the laser module and the driver die to the leadframe.

In one embodiment of the method, the leads extend along a first plane within the mold compound, the at least two die pads extend along a second plane within the mold compound different than the first plane so that a step is provided between the at least two die pads and the leads within the mold compound, and the driver die is attached to the leadframe in a flip-chip configuration.

In another embodiment of the method, the leads and the at least two die pads extend along a same first plane within the mold compound, the driver die is attached to the leadframe in a flip-chip configuration, and the surface at the first side of the leadframe which is not covered by the mold compound via an over-molded film-assist molding process.

Separately or in combination, an opening may be formed in the mold compound during the over-molded film-assist molding process, the opening extending to the surface of the at least two die pads and sized to receive the laser module.

Separately or in combination, the method may further comprise covering the laser module and filling the opening in the mold compound with a transparent epoxy.

Separately or in combination, the method may further comprise attaching one or more capacitors to the first side of the leadframe or to a second side of the leadframe opposite the first side.

According to an embodiment of a semiconductor package, the semiconductor package comprises: a leadframe comprising leads; a mold compound partly encasing the leadframe so that the leads protrude from the mold compound; a power transistor die attached to the leadframe at a first side of the leadframe; and a driver die attached to the leadframe at a second side of the leadframe opposite the first side so that the power transistor die and the driver die are disposed in a stacked arrangement, the driver die configured to control the power transistor die. The driver die is in direct electrical communication with the power transistor die only through the leadframe and any interconnects which attach the power transistor die and the driver die to the leadframe.

The semiconductor package may further comprise: a first metal clip attached to a side of the power transistor die facing away from the first side of the leadframe; and a second metal clip attached to a side of the driver transistor die facing away from the second side of the leadframe, wherein a surface of the first metal clip facing away from the first side of the leadframe is not covered by the mold compound and a surface of the second metal clip facing away from the second side of the leadframe is not covered by the mold compound, so that the semiconductor package has double-sided cooling via the first and the second metal clips.

According to an embodiment of a method of manufacturing a semiconductor package, the method comprises: providing a leadframe comprising leads; partly encasing the leadframe in a mold compound so that the leads protrude from the mold compound; attaching a power transistor die to the leadframe at a first side of the leadframe; and attaching a driver die to the leadframe at a second side of the leadframe opposite the first side so that the power transistor die and the driver die are disposed in a stacked arrangement, the driver die configured to control the power transistor die. The driver die is in direct electrical communication with the power transistor die only through the leadframe and any interconnects which attach the power transistor die and the driver die to the leadframe.

Before partly encasing the leadframe in the mold compound, the method may further comprises attaching a first metal clip to a side of the power transistor die facing away from the first side of the leadframe and attaching a second metal clip to a side of the driver transistor die facing away from the second side of the leadframe, wherein a surface of the first metal clip facing away from the first side of the leadframe is not covered by the mold compound and a surface of the second metal clip facing away from the second side of the leadframe is not covered by the mold compound, so that the semiconductor package has double-sided cooling via the first and the second metal clips.

Separately or in combination, the driver die and the power transistor die may each be attached to the leadframe in a flip-chip configuration.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide semiconductor package technology having a stacked arrangement of components. Direct electrical communication between the stacked components is provided only through a leadframe and any interconnects which attach the components to the leadframe. Components facing each other are attached to a single leadframe/distribution (routing) metal layer in the package which allows component such as drivers, passive components, laser modules and/or power devices to communicate over a very short distance, thereby lowering parasitic inductance within the package. The semiconductor package technology described herein yields a three-dimensional stacked component configuration with a single leadframe routing design, which is well-suited for applications requiring low inductance electrical connections between package components, such as LIDAR systems, power semiconductor modules, etc.

In the case of LIDAR systems and other laser light-based object recognition and tracking applications, the semiconductor package includes a leadframe having leads and a plurality of die pads (also commonly referred to as die paddles), and a mold compound partly encasing the leadframe so that the leads protrude from the mold compound and at least two of the plurality of die pads have a surface at a first side of the leadframe which is not covered by the mold compound. A laser module is attached to the surface of the at least two die pads which is not covered by the mold compound. The laser module is configured to emit laser light outward from the semiconductor package. A driver die is attached to the leadframe at a second side of the leadframe opposite the first side so that the laser module and the driver die are disposed in a stacked arrangement. The driver die is configured to control the laser module, e.g., by delivering the current needed by the laser module to operate for a particular application. The driver die is in direct electrical communication with the laser module only through the leadframe and any interconnects such as solder bumps, Cu pillars, etc. which attach the laser module and the driver die to the leadframe.

Figure 2:
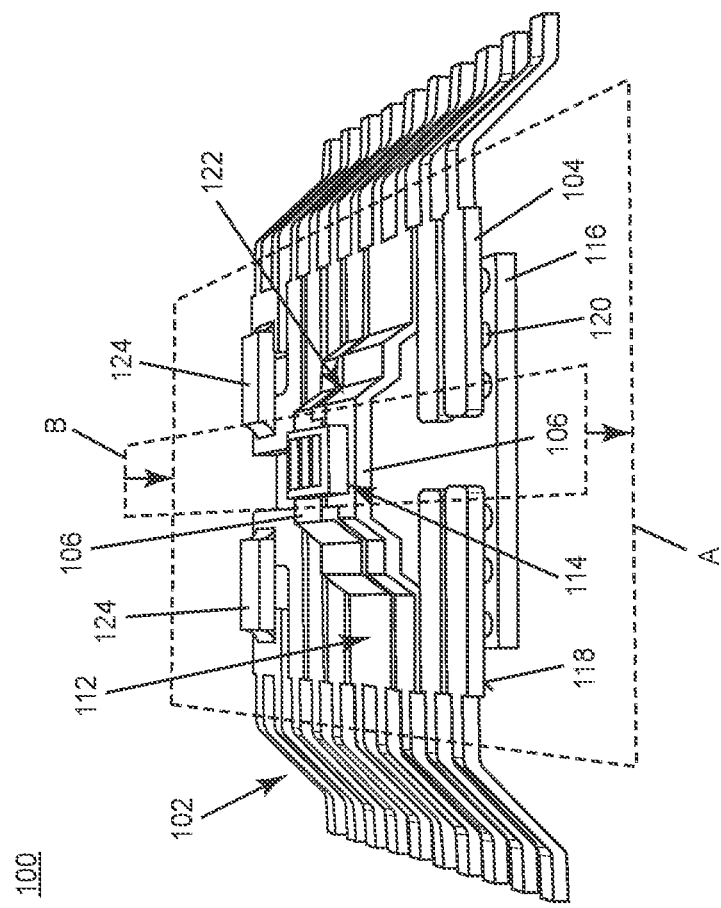
FIGS. 1 and 2 illustrate different perspective views of an embodiment of a semiconductor package for use in LIDAR and other laser light-based object recognition and tracking applications.
Figure 1:
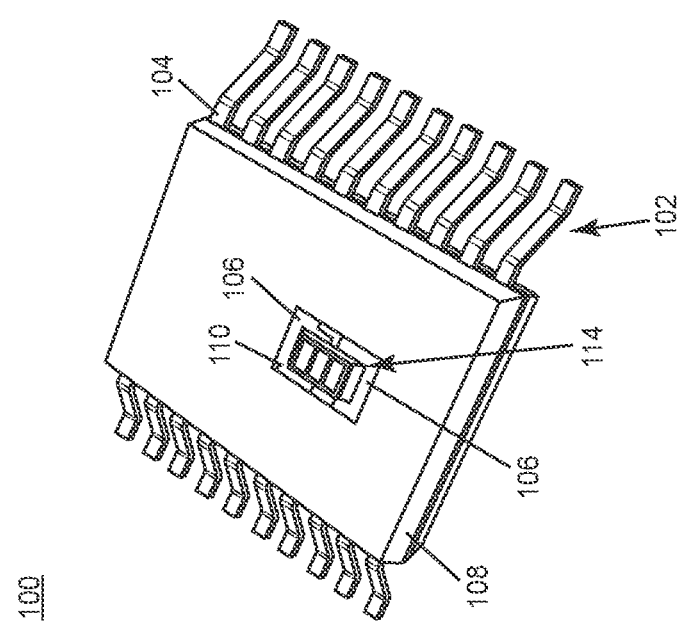

FIG. 1 illustrates a top perspective view of an embodiment of a semiconductor package 100 for use in LIDAR and other laser light-based object recognition and tracking applications. FIG. 2 illustrates a side perspective view of the semiconductor package 100, but without the mold compound encapsulant.

The semiconductor package 100 includes a leadframe 102 which has leads 104 and die pads 106. The lead frame 102 is a metal structure inside the package 100 for carrying signals and power to components within the package 100. A mold compound 108 partly encases the leadframe 102 so that the leads 104 protrude from the mold compound 108 and at least two of the die pads 106 have a surface 110 at a top side 112 of the leadframe 102 which is not covered by the mold compound 108. The leads 104 are shown as protruding from opposing side faces of the mold compound 108, e.g., in a small outline package (SOP) configuration. The leads 104 may protrude from the mold compound 108 in any typical molded package configuration such as SOP, flat package configuration like quad flat pack (QFP), quad flat no-leads (QFN), etc., through-hole configuration like single in-line package (SIP), dual in-line package (DIP), etc. Any typical mold compound may be used as the encapsulant 108 such as an epoxy mold compound. Mold compounds are typically formulated from epoxy resins containing inorganic fillers, catalysts, flame retardants, stress modifiers, adhesion promoters, and/or other additives.

The semiconductor package 100 also includes a laser module 114 attached to the surface 110 of the at least two die pads 106 which is not covered by the mold compound 108. The laser module 114 is configured to emit laser light outward from the semiconductor package 100. The laser module 114 may include a solid-state laser, a flash laser which has a single light source that illuminates the field of view in a single pulse, a phased array laser that can illuminate any direction by using a microscopic array of individual antennas, etc. The laser module 114 may include a 1D (one-dimensional) or 2D (two-dimensional) MEMS mirror and ASIC (application-specific integrated circuit) or controller for controlling the MEMS mirror.

A driver die 116 is attached to the leadframe 102 at a bottom side 118 of the leadframe 102 so that the laser module 114 and the driver die 116 are disposed in a stacked arrangement. The driver die 116 is configured to control the laser module 114, e.g., by delivering current needed by the laser module 114 to operate for a particular application. The driver die 116 may be configured to drive the laser module 114 to produce high-frequency laser pulses, e.g. in the nanosecond (ns) range, suitable for use in LIDAR and other laser light-based object recognition and tracking applications. For example, some LIDAR applications may utilize pulsed laser light sources emitting at 905 nm wavelength with an optical pulse power exceeding 100 watt at pulse widths from 5 to 20 ns. The driver die 116 may be fabricated from a suitable wideband semiconductor technology such as GaN and configured to meet such pulse power and frequency requirements. For example, the driver die 116 may be a GaN laser diode driver for LIDAR applications. The driver die 116 may be configured to meet other power and frequency requirements, which depend on the application in which the semiconductor package 100 is to be used, and may be fabricated from semiconductor technologies other than GaN such as Si, SiC, etc.

Regardless of the type of laser module 114 and driver die 116 employed, the driver die 116 is in direct electrical communication with the laser module 114 only through the leadframe 102 and any interconnects 120 such as solder bumps, Cu pillars, etc. which attach the laser module 114 and the driver die 116 to the leadframe 102. Hence, no additional electrical connectors such as wire bonds are used for routing signals directly between the driver die 116 and the laser module 114. With such a direct interconnection configuration provided by the single leadframe 102, a low inductance electrical interface is provided between the driver die 116 and the laser module 114 which yields improved frequency response.

According to the embodiment illustrated in FIGS. 1 and 2, the leadframe 102 has a down-set configuration. That is, the leads 104 extend along a first plane A within the mold compound 108 and the at least two die pads 106 attached to the laser module 114 extend along a second plane B within the mold compound 108 different than the first plane A as indicated by the downward facing arrows in FIG. 2, which results in a step 122 provided between the at least two die pads 106 and the leads 104 within the mold compound 108. The leadframe 102 may have a double downset as shown in FIGS. 1 and 2, a single downset, no downset, or more than two downsets, each 'downset' corresponding to a transition from one plane of the leadframe 102 to another plane (e.g. the transition between plane 'A' and plane 'B' represents a downset).

The semiconductor package 100 may further include one or more capacitors 124 attached to the top or bottom side 112, 118 of the leadframe 102. For example, the one or more capacitors 124 may include high-frequency capacitors for the power loop and/or a bypass capacitor for the driver die 116. The one or more capacitors 124 may be encased in the mold compound 108 as shown in FIGS. 1 and 2.

Figure 3:
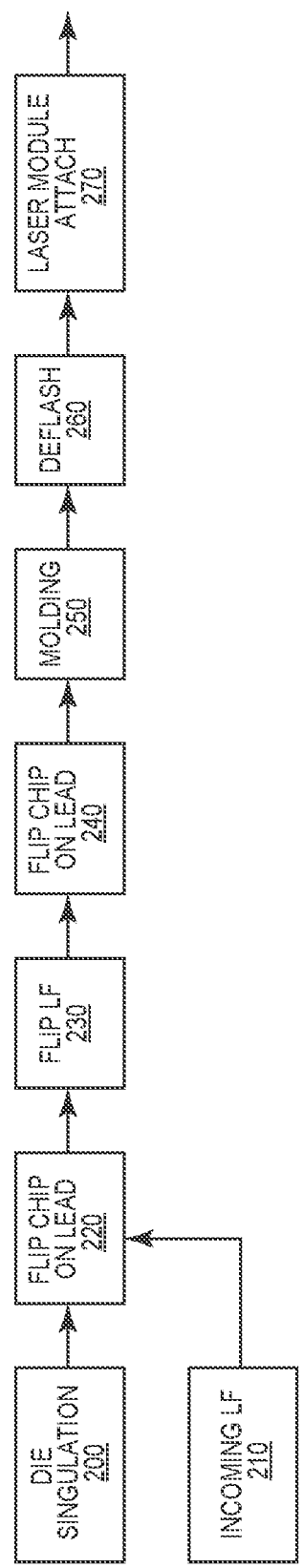
FIG. 3 illustrates a flow diagram of an embodiment of a method of manufacturing the semiconductor package shown in FIGS. 1 and 2.

FIG. 3 illustrates an embodiment of a method of manufacturing the semiconductor package 100 shown in FIGS. 1 and 2. The method includes singulating a semiconductor wafer which includes a plurality of driver dies into individual (separate) dies (Block 200). Leadframes are provided for the separated driver dies (Block 210). Each leadframe (LF) has leads and die pads configured to receive a semiconductor die. The leadframes also have the down-set configuration previously described herein. A separate driver die is attached to the leads of each leadframe at the bottom side of the leadframe in a flip-chip configuration (Block 220), e.g., via solder bumps, Cu pillars, etc. The leadframes are then flipped so that the top side of the leadframes are facing upward (Block 230). One or more capacitors are attached to the leads of each leadframe at the top side of the leadframe in a flip-chip configuration or to the bottom side of the leadframe (Block 240), e.g., via solder bumps, Cu pillars, etc. The leadframes are then partly encased in a mold compound using, e.g., a film-assist molding (FAM) process (Block 250). After the molding process, the leads protrude from the mold compound and at least two of the die pads have a surface at a top side of each leadframe which is not covered by the mold compound. The molded bodies may be subjected to a de-flashing process such as chemical de-flashing, laser de-flashing, etc. to remove flash from the molded parts which may accumulate during the molding process (Block 260). A laser module is then attached to the surface of the at least two die pads of each leadframe which is not covered by the mold compound (Block 270). The laser modules may be attached to the exposed part of the die pads as part of the package manufacturing process, or may be attached to the exposed die pads later, e.g., during a subsequent manufacturing process with utilizes the semiconductor package.

Figures 4, 5:
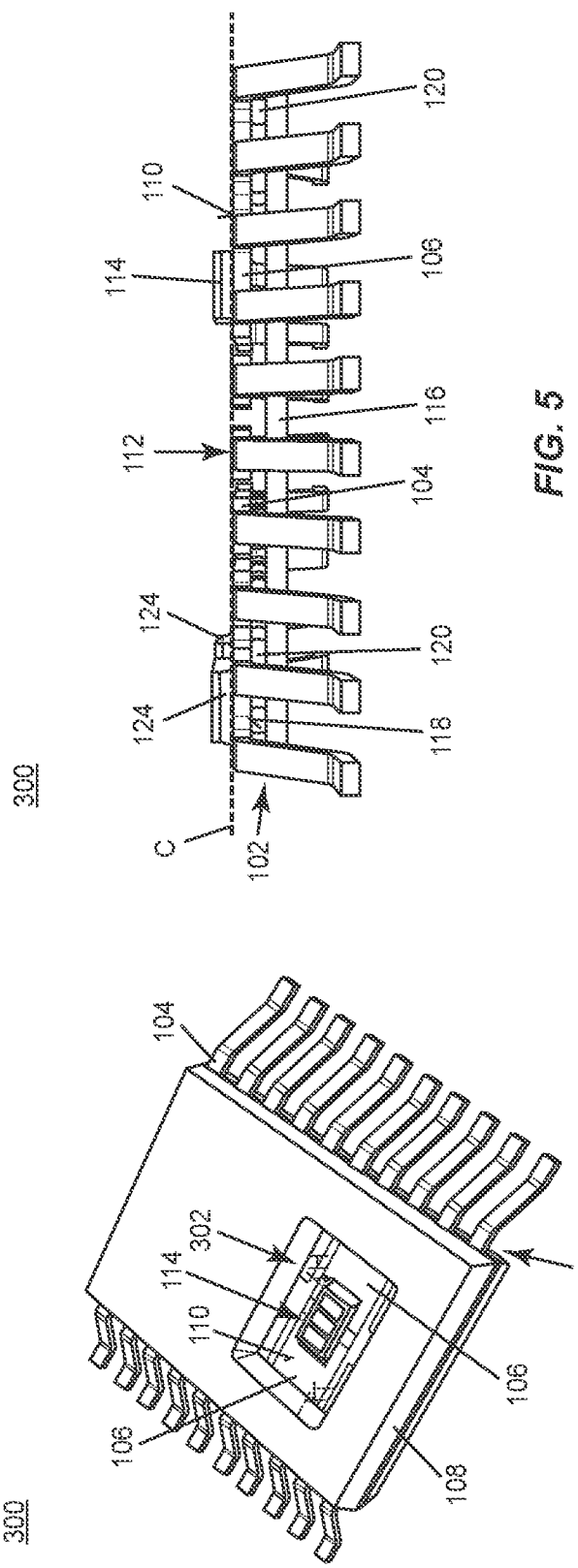
FIGS. 4 and 5 illustrate different perspective views of another embodiment of a semiconductor package for use in LIDAR and other laser light-based object recognition and tracking applications.

FIG. 4 illustrates a top perspective view of another embodiment of a semiconductor package 300 for use in LIDAR and other laser light-based object recognition and tracking applications. FIG. 5 illustrates a side view of the semiconductor package 300, but without the mold compound encapsulant.

The embodiment shown in FIGS. 4 and 5 is similar to the embodiment shown in FIGS. 1 and 2. Different, however, the mold compound 108 is formed using an over-molded FAM process to ensure that the surface 110 at the first side 112 of the leadframe 102 to which the laser module 114 is attached is not covered by the mold compound 108. The over-molded FAM process utilizes an insert in the FAM tool which creates an opening (window) 302 in the molded package body. The opening 302 is sized to receive the laser module 114. The laser module 114 is disposed in the opening 302 and attached to the surface 110 of the at least two die pads 106 exposed by the opening 302, e.g., by solder bumps, Cu pillars, etc. In one embodiment, the thickness (T) of the laser module 114 is less than the height (H) of the opening 302 in the mold compound 108 as shown in FIG. 4, as measured in a direction Z perpendicular to the top side 112 of the leadframe 102.

Further different than the embodiment shown in FIGS. 1 and 2, the leads 104 and the at least two die pads 106 attached to the laser module 114 may extend along the same plane C within the mold compound 108 as shown in FIG. 5. With this configuration, no step is provided between the die pads 106 and the leads 104 within the mold compound 108.

Figure 6:
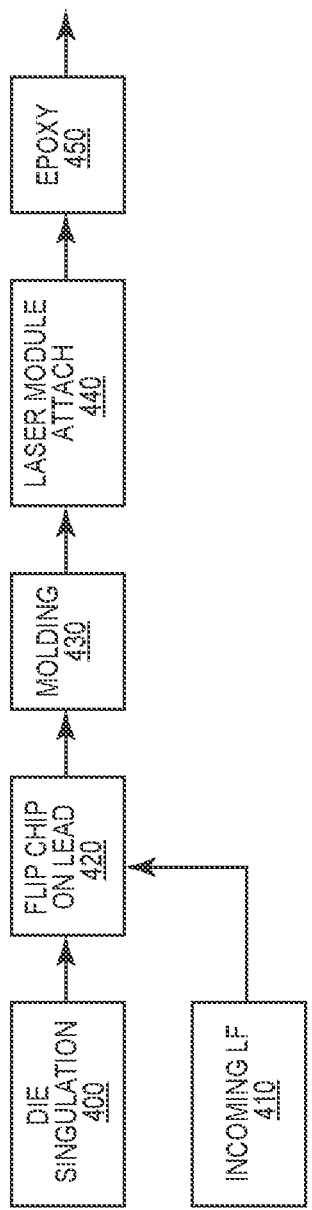
FIG. 6 illustrates a flow diagram of an embodiment of a method of manufacturing the semiconductor package shown in FIGS. 4 and 5.

FIG. 6 illustrates an embodiment of a method of manufacturing the semiconductor package 300 shown in FIGS. 4 and 5. The method includes singulating a semiconductor wafer which includes a plurality of driver dies into individual (separate) dies (Block 400). Leadframes are provided for the separated driver dies (Block 410). Each leadframe (LF) has leads and die pads configured to receive a semiconductor die. A separate driver die is attached to the leads of each leadframe at the bottom side of the leadframe in a flip-chip configuration, e.g., via solder bumps, Cu pillars, etc., the leadframes are then flipped so that the top side of the leadframes are facing upward, and one or more capacitors are attached to the leads of each leadframe at the top side of the leadframe in a flip-chip configuration, e.g., via solder bumps, Cu pillars, etc. or to the bottom side of the leadframe (Block 420). The leadframes are then partly encased in a mold compound using an over-molded FAM to create an opening (window) in each molded package body for receiving a laser module, and the molded parts may be subjected to a de-flashing process such as chemical de-flashing, laser de-flashing, etc. to remove flash which may accumulate during the molding process (Block 430). After the FAM process, the leads protrude from the mold compound and the opening formed in each molded package body exposes at least two of the die pads. A laser module is then attached to the surface of the at least two die pads of each leadframe which is exposed by the opening formed in the mold compound (Block 440). The laser modules are then covered and the openings in the mold compound filled with a transparent epoxy such as a glob top, potting compound, etc. (Block 450).

Figure 7:
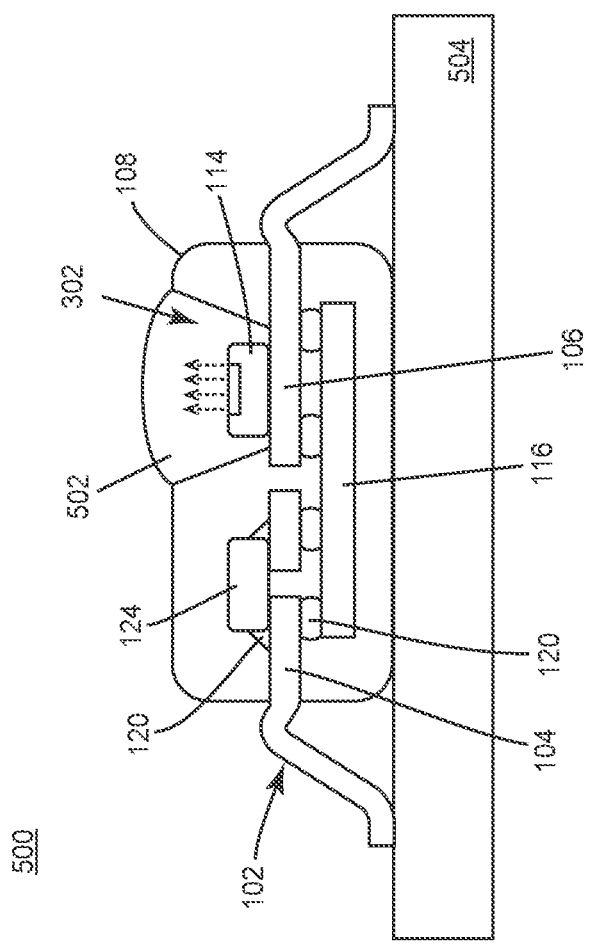
FIG. 7 illustrates a cross-sectional view of another embodiment of a semiconductor package for use in LIDAR and other laser light-based object recognition and tracking applications.

FIG. 7 illustrates a cross-sectional view of an embodiment of a semiconductor package 500 manufactured in accordance with the method of FIG. 6, after covering the laser module 114 and filling the opening 302 in the mold compound 108 with transparent epoxy 502. The transparent epoxy 502 minimally interferes with the laser light emitted outward from the semiconductor package 500 by the laser module 114. The emitted light is illustrated as dotted lines in FIG. 7. The semiconductor package 500 may be attached to a substrate 504 such as a printed circuit board (PCB) which forms part of a larger assembly such as a LIDAR system.

Figure 8:
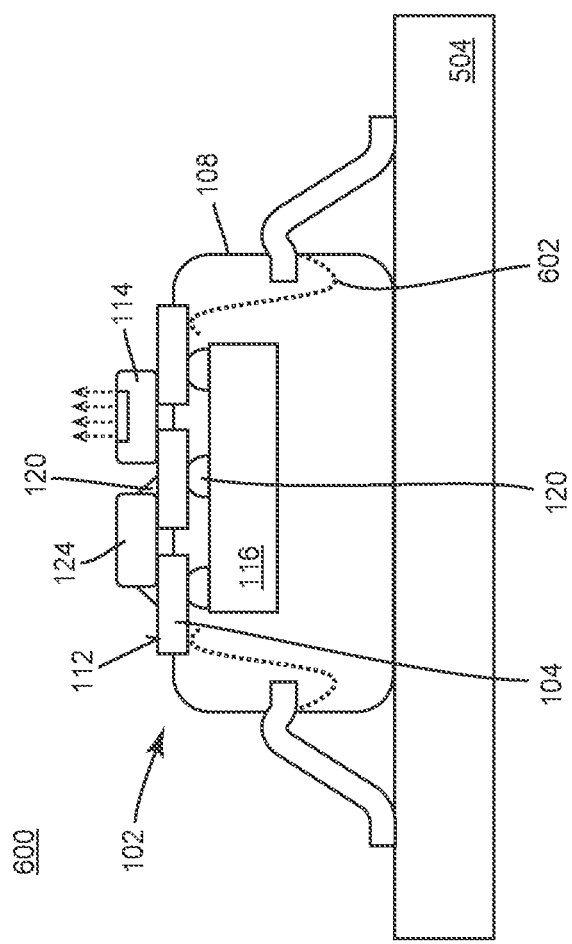
FIG. 8 illustrates a cross-sectional view of another embodiment of a semiconductor package for use in LIDAR and other laser light-based object recognition and tracking applications.

FIG. 8 illustrates a cross-sectional view of another embodiment of a semiconductor package 600 for use in LIDAR and other laser light-based object recognition and tracking applications. The embodiment shown in FIG. 8 is similar to the embodiment shown in FIG. 7. Different, however, the entire top side 112 of the leadframe 102 is not covered by the mold compound 108 so that all of the components attached to the top side 112 of the leadframe 102 are free of the mold compound 108, including the one or more capacitors 124 and the laser module 114. Also, the semiconductor package 600 shown in FIG. 8 may include wire bonds 602 for forming lead-to-lead electrical connections inside the molded package. In FIG. 7, all internal electrical connections are provided by the leadframe 102.

Figure 9:
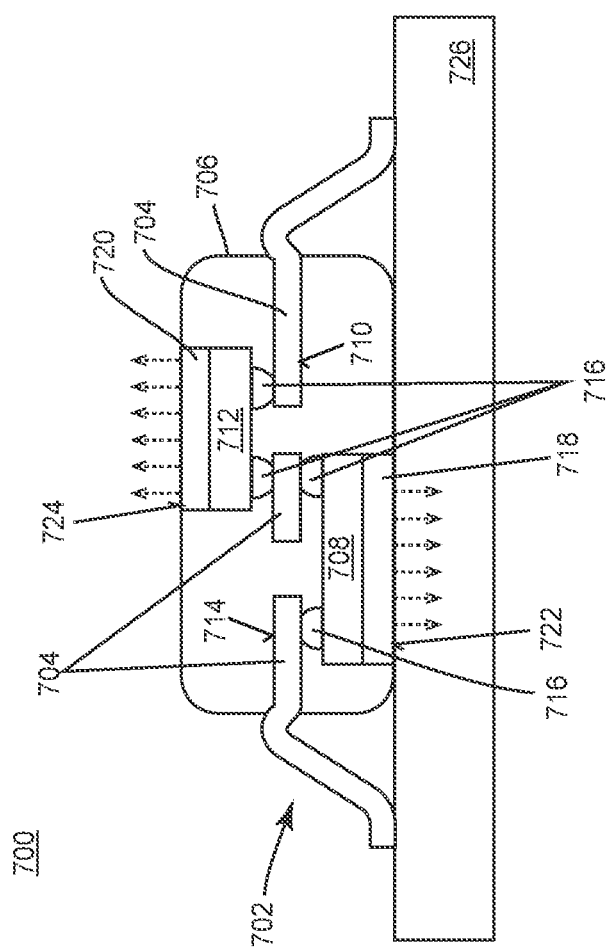
FIG. 9 illustrates a cross-sectional view of an embodiment of a power semiconductor package for use in power module applications.

FIG. 9 illustrates a cross-sectional view of an embodiment of a power semiconductor package 700 for use in power module applications such as automotive, solar inverters, etc. The power semiconductor package 700 includes a leadframe 702 having leads 704, and a mold compound 706 partly encasing the leadframe 702 so that the leads 704 protrude from the mold compound 706, e.g., in a SOP, QFP, QFN, SIP, DIP, etc. configuration. Any typical mold compound may be used as the encapsulant 706 such as an epoxy mold compound.

The power semiconductor package 700 also includes a power transistor die 708 attached to the leadframe 702 at one side 710 of the leadframe 702, e.g., the bottom side. The power transistor die may be a power MOSFET (metal-oxide semiconductor field-effect transistor) die, an IGBT (insulated gate bipolar transistor) die, a JFET (junction FET) die, a HEMT (high-electron mobility transistor) die, etc. The power transistor die 708 includes a semiconductor device used as a switch or rectifier in power electronics, such as a switch-mode power supply as an example.

The power semiconductor package 700 further includes a driver die 712 attached to the opposite side 714 of the leadframe 702 as the power transistor die 708. This way, the power transistor die 708 and the driver die 712 are disposed in a stacked arrangement. The driver die 712 is configured to control the power transistor die 708, e.g., by switching on and off the semiconductor device included in the power transistor die 708. The driver die 712 is in direct electrical communication with the power transistor die 708 only through the leadframe 702 and any interconnects 716 such as solder bumps, Cu pillars, etc. which attach the power transistor die 708 and the driver die 712 to the leadframe 702. With such a direct interconnection configuration provided by the single leadframe 702, a low inductance electrical interface is provided between the driver die 712 and the power transistor die 708 which yields increased switching frequency capability.

According to one embodiment, the power semiconductor package 700 also includes a first metal clip 718 such as a Cu clip attached to the side of the power transistor die 708 facing away from the leadframe 702 and a second metal 720 clip such as a Cu clip attached to the side of the driver die 712 facing away from the leadframe 702. The surface 722 of the first metal clip 718 facing away from the leadframe 702 is not covered by the mold compound 706. The surface 724 of the second metal clip 720 facing away from the leadframe 702 also is not covered by the mold compound 706. With this configuration, the power semiconductor package 700 has double-sided cooling via the first and the second metal clips 718, 720. The double-sided cooling is graphically illustrated by respective groups of doted lines, each group of doted lines representing a heat dissipation path for the power semiconductor package 700. The power semiconductor package 700 may be attached to a substrate 726 such as a PCB which forms part of a larger assembly such as a power module.

Figure 10:
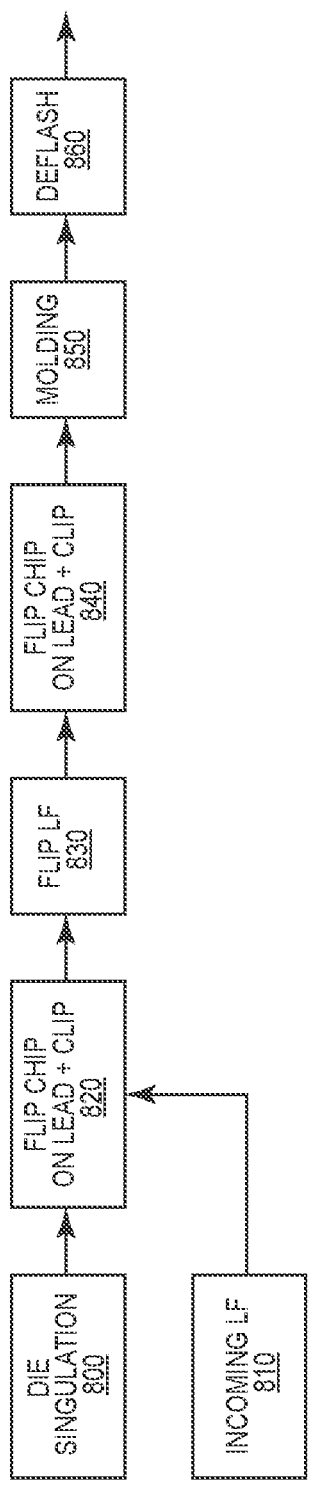
FIG. 10 illustrates a flow diagram of an embodiment of a method of manufacturing the power semiconductor package shown in FIG. 9.

FIG. 10 illustrates an embodiment of a method of manufacturing the power semiconductor package 700 shown in FIG. 9. The method includes singulating a first semiconductor wafer which includes a plurality of power transistor dies into individual (separate) transistor dies, and singulating a second semiconductor wafer which includes a plurality of power semiconductor driver dies into individual driver dies (Block 800). Leadframes are provided for the separated dies (Block 810). Each leadframe (LF) has leads configured to receive a semiconductor die. A separate power transistor die is attached to the leads of each leadframe at the bottom side of the leadframe in a flip-chip configuration, e.g., via solder bumps, Cu pillars, etc., and a first metal clip such as a Cu clip is attached to the side of each power transistor die facing away from the corresponding leadframe (Block 820). The leadframes are then flipped so that the opposite side of the leadframes are facing upward (Block 830). A separate driver die is attached to the leads of each leadframe at the top side of the leadframe in a flip-chip configuration, e.g., via solder bumps, Cu pillars, etc., and a second metal clip such as a Cu clip is attached to the side of each driver die facing away from the corresponding leadframe (Block 840). The leadframes are then partly encased in a mold compound using, e.g., using a FAM process (Block 850). Inserts may be used during the FAM process to ensure the surface of the first metal clip facing away from the leadframe is not covered by the mold compound, and that the surface of the second metal clip facing away from the leadframe also is not covered by the mold compound, so that the semiconductor package has double-sided cooling via the first and the second metal clips. The molded bodies may be subjected to a de-flashing process such as chemical de-flashing, laser de-flashing, etc. to remove flash from the molded parts which may accumulate during the molding process (Block 860).

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
   a leadframe comprising leads and a plurality of die pads;
   a mold compound partly encasing the leadframe so that the leads protrude from the mold compound and at least two of the plurality of die pads have a surface at a first side of the leadframe which is not covered by the mold compound;
   a laser module attached to the surface of the at least two die pads which is not covered by the mold compound, the laser module configured to emit laser light outward from the semiconductor package; and
   a driver die attached to the leadframe at a second side of the leadframe opposite the first side so that the laser module and the driver die are disposed in a stacked arrangement, the driver die configured to control the laser module,
   wherein the driver die is in direct electrical communication with the laser module only through the leadframe and any interconnects which attach the laser module and the driver die to the leadframe.

2. The semiconductor package of claim 1, wherein the leads extend along a first plane within the mold compound, and wherein the at least two die pads extend along a second plane within the mold compound different than the first plane so that a step is provided between the at least two die pads and the leads within the mold compound.

3. The semiconductor package of claim 1, wherein the leads and the at least two die pads extend along a same first plane within the mold compound.

4. The semiconductor package of claim 3, wherein the mold compound has an opening which extends to the surface of the at least two die pads, and wherein the laser module is disposed in the opening.

5. The semiconductor package of claim 4, further comprising a transparent epoxy covering the laser module and filling the opening in the mold compound.

6. The semiconductor package of claim 4, wherein a thickness of the laser module is less than a height of the opening in the mold compound, and wherein the thickness of the laser module and the height of the opening are measured in a direction perpendicular to the first side of the leadframe.

7. The semiconductor package of claim 1, further comprising one or more capacitors attached to the first side of the leadframe or to a second side of the leadframe opposite the first side.

8. The semiconductor package of claim 7, wherein the one or more capacitors are encased in the mold compound.

9. The semiconductor package of claim 7, wherein the first side of the leadframe is not covered by the mold compound so that the one or more capacitors are not encased in the mold compound.

10. A method of manufacturing a semiconductor package, the method comprising:
    providing a leadframe comprising leads and a plurality of die pads;
    partly encasing the leadframe in a mold compound so that the leads protrude from the mold compound and at least two of the plurality of die pads have a surface at a first side of the leadframe which is not covered by the mold compound;
    attaching a laser module to the surface of the at least two die pads which is not covered by the mold compound, the laser module configured to emit laser light outward from the semiconductor package; and
    attaching a driver die to the leadframe at a second side of the leadframe opposite the first side so that the laser module and the driver die are disposed in a stacked arrangement, the driver die configured to control the laser module, wherein the driver die is in direct electrical communication with the laser module only through the leadframe and any interconnects which attach the laser module and the driver die to the leadframe.

11. The method of claim 10, wherein the leads extend along a first plane within the mold compound, wherein the at least two die pads extend along a second plane within the mold compound different than the first plane so that a step is provided between the at least two die pads and the leads within the mold compound, and wherein the driver die is attached to the leadframe in a flip-chip configuration.

12. The method of claim 10, wherein the leads and the at least two die pads extend along a same first plane within the mold compound, wherein the driver die is attached to the leadframe in a flip-chip configuration, and wherein the surface at the first side of the leadframe which is not covered by the mold compound via an over-molded film-assist molding process.

13. The method of claim 12, wherein an opening is formed in the mold compound during the over-molded film-assist molding process, the opening extending to the surface of the at least two die pads and sized to receive the laser module.

14. The method of claim 13, further comprising:
covering the laser module and filling the opening in the mold compound with a transparent epoxy.

15. The method of claim 10, further comprising:
attaching one or more capacitors to the first side of the leadframe or to a second side of the leadframe opposite the first side.

* * * * *